US008826197B2

(12) United States Patent  
Muddu et al.

(10) Patent No.: US 8,826,197 B2  
(45) Date of Patent: Sep. 2, 2014

(54) PATTERN-BASED REPLACEMENT FOR LAYOUT REGULARIZATION

(71) Applicant: GLOBALFOUNDRIES Inc., Grand Cayman (KY)

(72) Inventors: Swammy Muddu, Milpitas, CA (US); Rani A. Ghaida, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/757,218

(22) Filed: Feb. 1, 2013

(65) Prior Publication Data

US 2014/0223396 A1    Aug. 7, 2014

(51) Int. Cl.  
*G06F 17/50*    (2006.01)

(52) U.S. Cl.  
CPC ..................................... *G06F 17/50* (2013.01)  
USPC ............................................................ 716/55

(58) Field of Classification Search  
USPC ..................................... 716/100, 55  
See application file for complete search history.

(56) References Cited

U.S. PATENT DOCUMENTS

| | | | | |
|---|---|---|---|---|
| 7,555,736 B2 * | 6/2009 | Cadouri | ...................... | 716/106 |
| 7,657,852 B2 * | 2/2010 | Waller | ..................... | 716/119 |
| 8,418,105 B1 * | 4/2013 | Wang et al. | ................ | 716/110 |
| 8,429,582 B1 * | 4/2013 | Lai et al. | .................... | 716/112 |
| 8,490,036 B2 * | 7/2013 | Waller | ..................... | 716/106 |
| 8,516,406 B1 * | 8/2013 | Lai et al. | ....................... | 716/54 |
| 8,543,965 B1 * | 9/2013 | Lai et al. | .................... | 716/136 |
| 2006/0281200 A1 * | 12/2006 | Cadouri | ....................... | 438/14 |
| 2007/0044060 A1 * | 2/2007 | Waller | ....................... | 716/13 |
| 2009/0037852 A1 * | 2/2009 | Kobayashi et al. | ............ | 716/2 |
| 2010/0122227 A1 * | 5/2010 | Waller | .......................... | 716/5 |

* cited by examiner

*Primary Examiner* — Suchin Parihar  
(74) *Attorney, Agent, or Firm* — Maxine L. Barasch; Keohane & D'Alessandro, PLLC

(57) ABSTRACT

Methods and systems for generating a regularized integrated circuit layout are disclosed. Pattern replacement of various portions of wiring within an integrated circuit layout with a common pattern is performed in order to generate a regularized layout. The regularized layout is then subjected to additional mask data preparation processing, such as optical proximity correction.

10 Claims, 7 Drawing Sheets

PATTERN-BASED REPLACEMENT FOR LAYOUT REGULARIZATION

FIELD OF THE INVENTION

The present invention relates generally to semiconductors and, more particularly, to generating layout data for a semiconductor integrated circuit.

BACKGROUND

As the trend of device miniaturization continues, the dimension of a strip conductor such as a metal wiring conductor formed on a semiconductor substrate has become smaller than the light-source wavelength of a drawing exposure apparatus. This has added challenges to the processing of wiring strip conductors in accordance with intended design sizes. In particular, due to the miniaturization and the high-density integration of a mask pattern, the pattern arrangement plays a large role in the process of forming strip conductors through photolithography or etching processing. Optical proximity correction processing (hereinafter, described as OPC processing), in which a correction pattern is preliminarily added to a designed pattern, is generally performed so that the actual size of a processed strip conductor approaches the desirable size of the strip conductor in accordance with design goals.

However, the physical implementation of the connectivity intent of designs is driven by algorithms and design methodologies within the confines of design rules. The routing phase of the integrated circuit (IC) implementation flow creates the connectivity between design elements (transistors, standard cells, or modules) through a multi-level wiring structure which is made up of 2D wiring layers connected by via layers. Routing is performed by automated, computer-aided design (CAD) tools or by designers (who utilize structured or semi-structured design methodologies to create or guide the wiring structure). There is a tradeoff between constrained design rules and layout complexity. It is therefore desirable to have systems and methods for improvements in the generation of layout data of a semiconductor integrated circuit.

SUMMARY

In general, embodiments of the present invention provide a design methodology that performs pattern replacement of various portions of wiring within an integrated circuit layout and replaces them with a common pattern, generating a regularized layout. The regularized layout is then subjected to additional processing, such as optical proximity correction. This serves to provide improved manufacturability, and simplifies mask data preparation process processes such as optical proximity correction (OPC) and source mask optimization (SMO). Furthermore, since process control in manufacturing steps such as exposure, etch, and CMP (chemical mechanical polishing) are tightly correlated with the layout, regularization of the layout can drive improved process control by minimizing uniqueness of layout situations that interact with physical processes in manufacturing. Other advantages may include simplified post-silicon debug, a more uniform layout density, and better CMP control.

A first aspect of the present invention includes a method of compiling layout regularization data, comprising: identifying a plurality of replacement patterns for use in an integrated circuit layout; determining a replacement pattern score for each replacement pattern that shares a similar pattern function; and storing the replacement pattern with a maximum replacement pattern score in a computer-readable medium.

A second aspect of the present invention includes a method of designing an integrated circuit, comprising: identifying a plurality of synonymous patterns in an integrated circuit layout; classifying a plurality of synonymous patterns into one or more synonymous pattern classes; and replacing each synonymous pattern in every synonymous pattern class with a corresponding replacement pattern to generate a regularized layout.

A third aspect of the present invention includes a computer-readable medium comprising instructions, said instructions, when executed by a processor, performing the steps of: identifying a plurality of synonymous patterns in an integrated circuit layout; classifying a plurality of synonymous patterns into one or more synonymous pattern classes; and replacing each synonymous pattern in every synonymous pattern class with a corresponding replacement pattern to generate a regularized layout.

BRIEF DESCRIPTION OF THE DRAWINGS

Certain elements in some of the figures may be omitted, or illustrated not to scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which.

DETAILED DESCRIPTION

Figure 1:
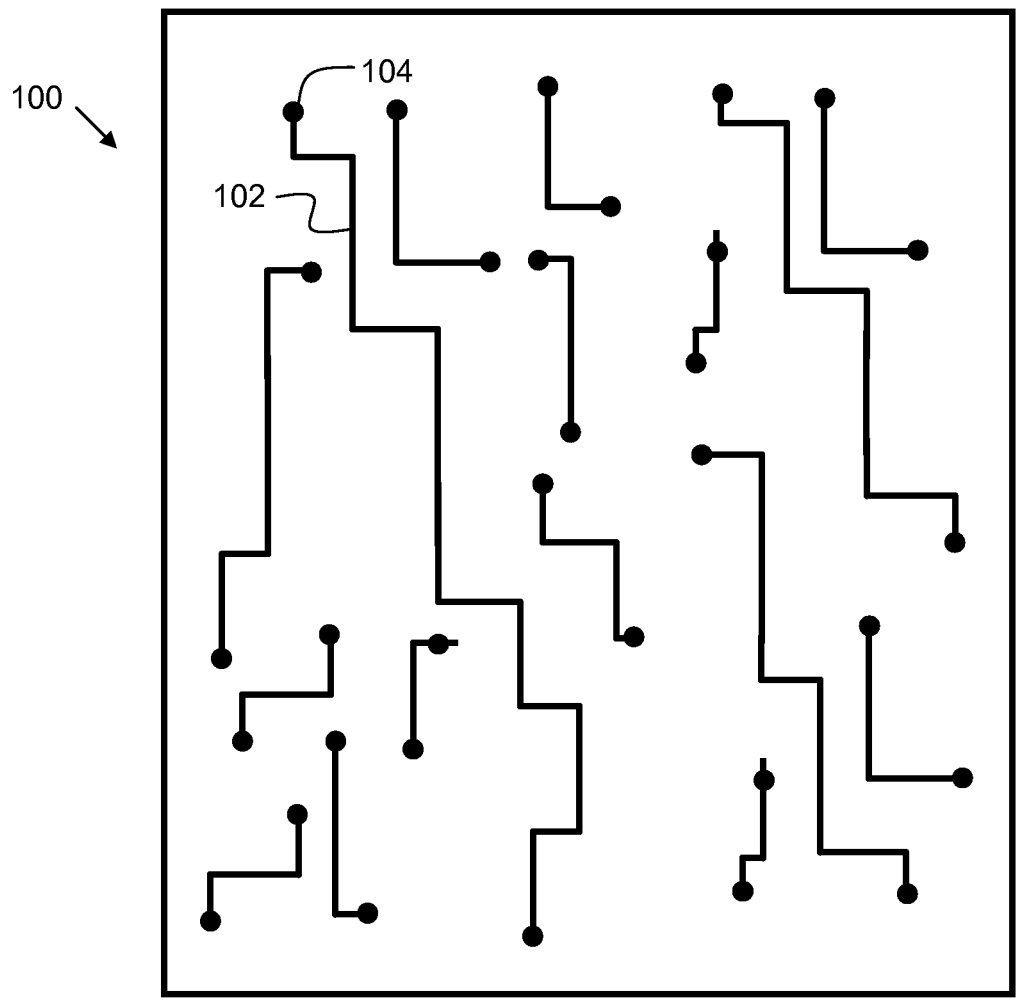
FIG. 1 shows an exemplary integrated circuit layout for illustrative embodiments.

Exemplary embodiments will now be described more fully herein with reference to the accompanying drawings, in which exemplary embodiments are shown. Exemplary embodiments of the invention provide a design methodology that performs pattern replacement of various portions of wiring within an integrated circuit layout and replaces them with a common pattern, generating a regularized layout. The regularized layout is then subjected to additional processing, such as optical proximity correction. This serves to provide improved manufacturability, and simplifies mask data preparation processes such as optical proximity correction (OPC)

and source mask optimization (SMO). Furthermore, since process control in manufacturing steps such as exposure, etch, and CMP (chemical mechanical polishing) are tightly correlated with the layout, regularization of the layout can drive improved process control by minimizing uniqueness of layout situations that interact with physical processes in manufacturing. Other advantages may include simplified post-silicon debug, a more uniform layout density, and better CMP control.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

FIG. 1 shows a wiring level of an exemplary integrated circuit layout 100. The layout 100 includes a plurality of conductive lines 102, which are typically made from metal and formed by lithographic methods. Lines 102 may terminate at a via 104, which connects the wiring level to other wiring levels within the integrated circuit.

Within many integrated circuits, wiring patterns which are similar, but not identical, may appear in numerous places within the layout. Increased variation within a layout increases the manufacturing complexity and may adversely affect product yield. Hence, it is desirable to reduce pattern variation within the layout where possible. Embodiments of the present invention use computer systems to identify multiple patterns within a layout that provide the same connectivity. These patterns are referred to as "synonymous patterns." The synonymous patterns are then replaced by a single pattern, referred to as a "replacement pattern," which accomplishes the same connectivity as each of the synonymous patterns. This reduces the variability within the layout and allows downstream processes such as OPC to be optimized to a layout with reduced variability. The layout with reduced variability is referred to as a "regularized layout." A "pattern function" is a description of how a pattern interacts with its surroundings. One such example may be the connectivity of a pattern to its surroundings in the layout. In addition to connectivity, the layout neighborhood of the "pattern function" may also be given consideration. Layout features in the neighborhood can introduce manufacturing constraints, which may lead to design rule violations.

Figure 2A:
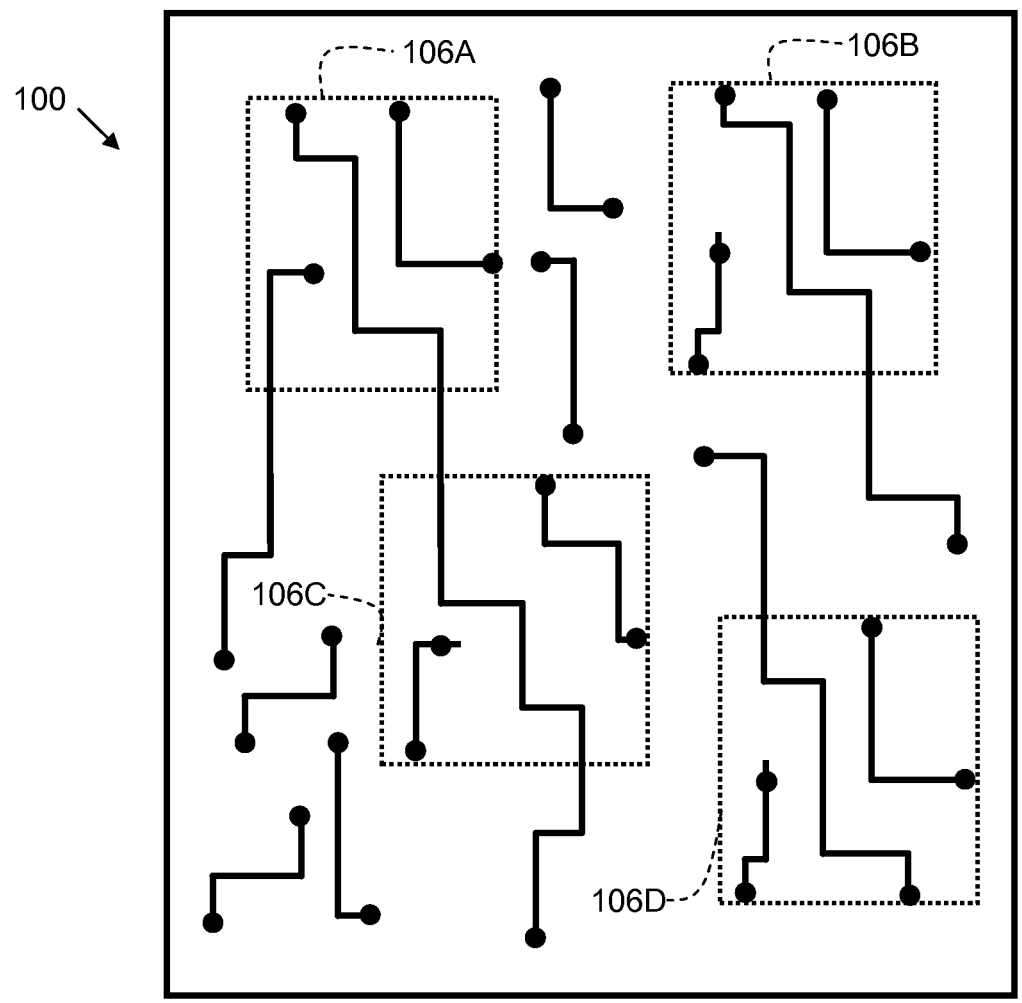
FIG. 2A shows an exemplary integrated circuit indicating synonymous patterns for illustrative embodiments.

FIG. 2A shows integrated circuit layout 100 indicating synonymous patterns 106A-106D. Each pattern provides identical connectivity (identical termination points), but the wiring paths differ. The synonymous patterns 106A-106D may be identified via a pattern recognition process executing on a computer system to identify locations where the connectivity is equivalent. In general, integrated circuit layout 100 may be thought of as containing multiple points interconnected by lines. However, each feature, such as a via or line, is in reality a multidimensional feature having finite width, length, and height. Hence, there are constraints (also referred to as "design rules") that aid in providing successful fabrication of an integrated circuit.

Figure 2B:
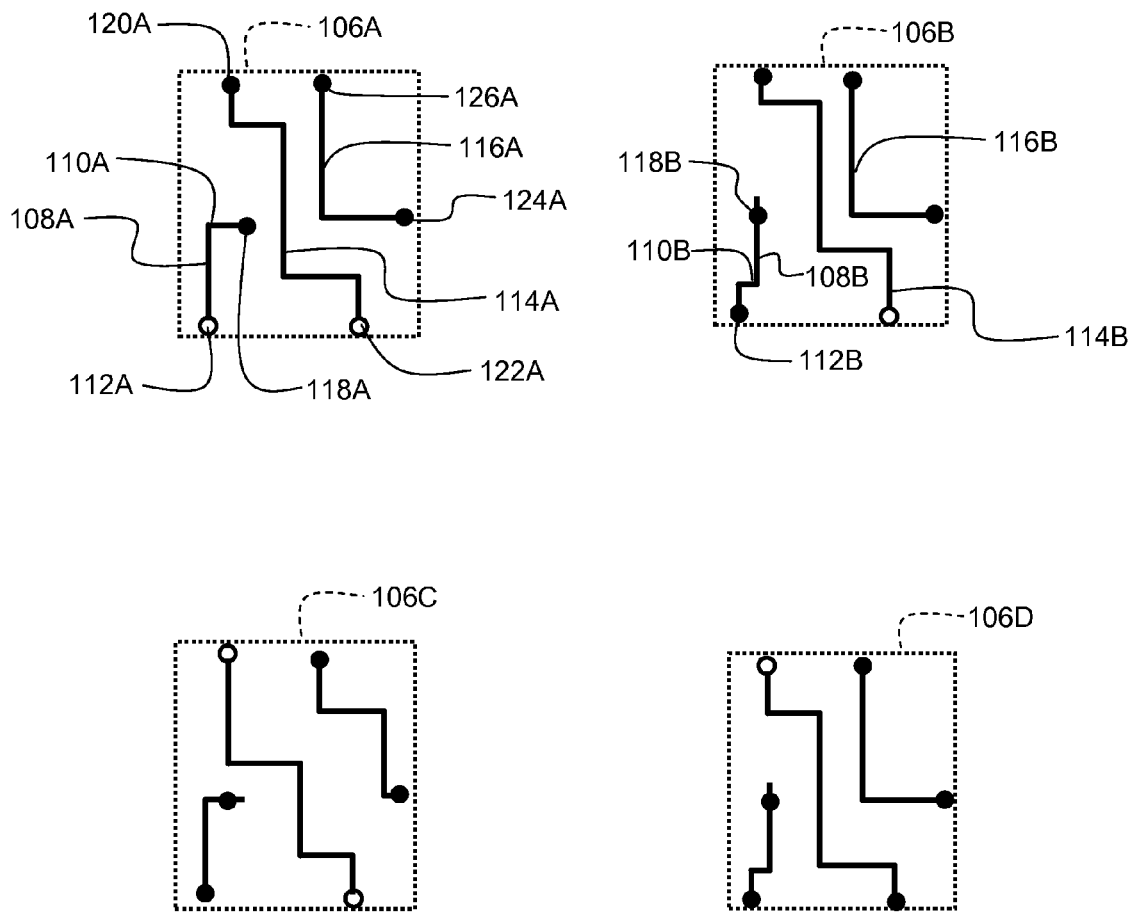
FIG. 2B shows details of synonymous patterns for illustrative embodiments.

FIG. 2B shows details of synonymous patterns 106A-106D. Pattern 106A includes three lines 108A, 114A, and 116A. Line 108A has a first termination point 118A which is a via, and second termination point 112A which is a wire connection. A wire connection is a point where a line enters the pattern, but does not represent a via location. Vias are represented by a solid circle, and wire connections are represented by a hollow circle. Line 114A comprises termination point 120A and 122A. Line 116A comprises termination point 124A and 126A. Similarly, pattern 106B includes three lines 108B, 114B, and 116B. Line 108B has termination points 118B and 112B. The spatial relationship between termination point 118A and 112A is the same as the spatial relationship between termination point 118B and 112B. The interconnectivity between termination points 118A and 112A is identical as between termination points 118B and 112B. The interconnectivity is also identical for lines 114A and 114B, and for lines 116A and 116B. Hence, since patterns 106A and 106B have an equal number of lines, each providing the same connectivity, patterns 106A and 106B are synonymous. Patterns 106C and 106D are also synonymous with patterns 106A and 106B. However, the patterns are not identical. For example, line 108A has turn 110A whereas line 108B has turn 110B in a different location. That is, the path of line 108A is different than the path of line 108B, even though the relative location of the termination points of both lines is equivalent. Hence, these patterns are eligible to be replaced by a single pattern. This pattern is referred to as a "replacement pattern." Note that in some embodiments, lines may extend slightly beyond the termination points to account for lithographic effects. In other instances, lines may extend beyond the termination points as part of the design itself.

Figure 2C:
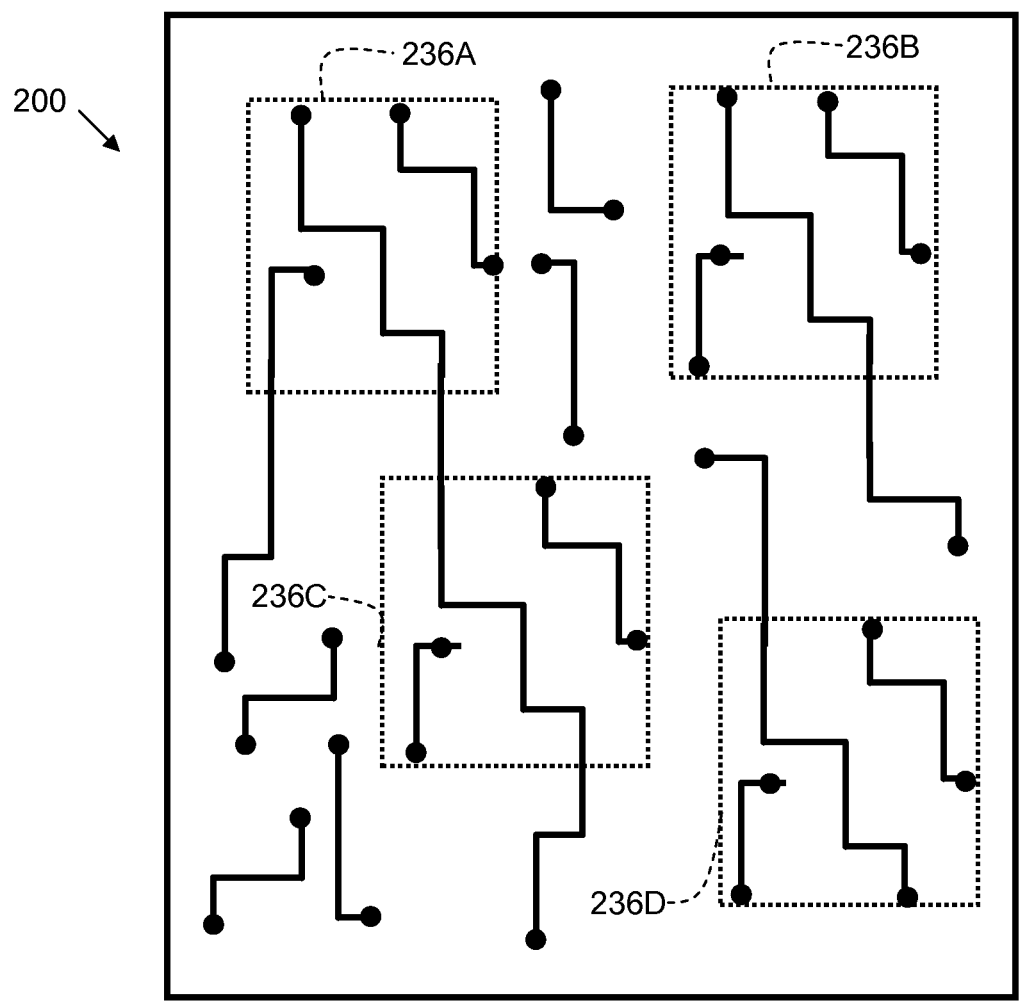
FIG. 2C shows an exemplary regularized layout in accordance with illustrative embodiments.

FIG. 2C shows an exemplary regularized layout 200 for layout 100 of FIG. 2A. In layout 200, patterns 236A-236D are made of a single replacement pattern. Hence, the functionality of layout 100 is preserved while reducing the variation within the layout. The regularized layout can then be input to other processes such as OPC and Source-Mask Optimization (SMO). Reducing the number of unique patterns in layouts (i.e., more "regular" layouts) leads to improved OPC and SMO processing. This in turn can lead to better manufacturing and improved product yield.

A variety of criteria can be used to select the replacement pattern used to replace synonymous patterns. The criteria may include, but are not limited to, determining a printability factor, determining a yield factor, determining a double-patterning compatibility factor, determining a minimum wire (line) length, and determining a minimum number of wire turns. In some embodiments, a replacement pattern score may be determined for each replacement pattern. The score may be derived from one or more factors, and may be of the general form:

$$S=K_1*A+K_2*B+K_3*C+K_4*D+K_5*E$$

where:
S is the replacement pattern score;
$K_1$-$K_5$ are constants;
A is the printability factor;
B is the yield factor;
C is the double-patterning compatibility factor;
D is the total wire length of the replacement pattern; and
E is the number of wire turns in the replacement pattern.

Constants can be set to zero to exclude a particular factor. In some embodiments, the factors may be based on empirical data. For example, a printability factor may be determined by performing lithography simulations and/or actual lithography tests with physical samples to determine which patterns reproduce the most reliably. The yield factor may be derived from simulated and/or actual yield data for a given pattern, considering the number of defects found within a specific pattern during a fabrication run. The double-patterning compatibility factor may take into account the arrangement of the lines within the pattern, and in particular, the distance between the lines, to determine if it is compatible with a given double-patterning technique and/or critical dimension. The total wire length of the replacement pattern may be measured in normalized values, or in physical values such as nanometers. In some embodiments, a higher value for S indicates a better replacement pattern. In some embodiments where a higher value for S indicates a better replacement pattern, constants K4 and/or K5 may be negative, such that a longer total wire length or a larger number of wire turns serves to lower the replacement pattern score.

Figure 3:
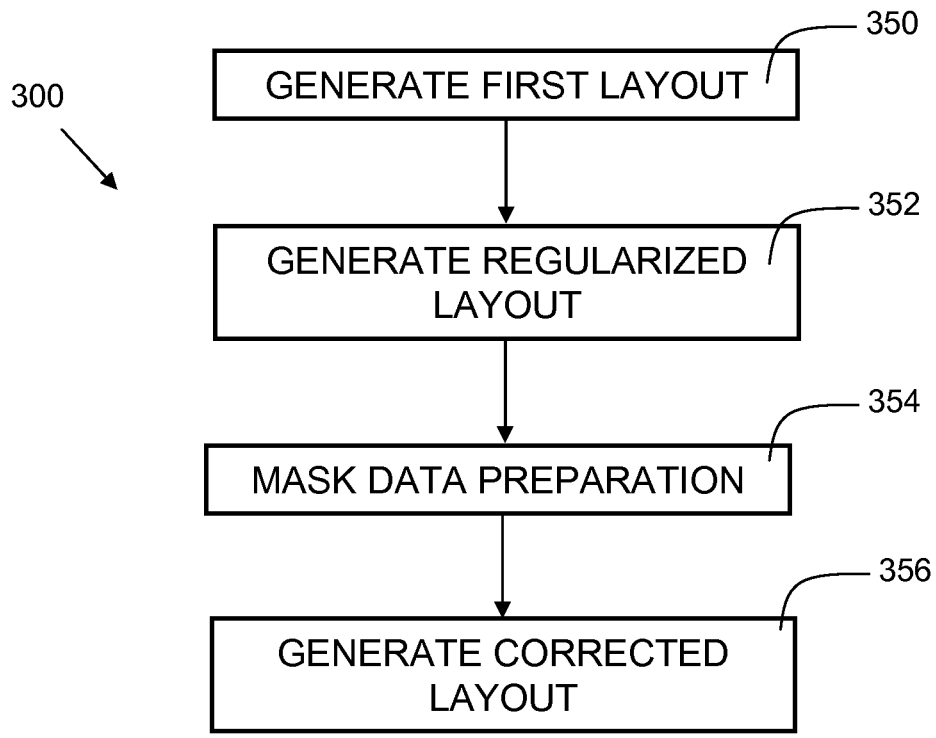
FIG. 3 is a flowchart indicating process steps for generating layout data in accordance with illustrative embodiments.

FIG. 3 is a flowchart 300 indicating process steps for generating layout data in accordance with illustrative embodiments. In process step 350, a first layout is generated. This layout may be generated by an automatic routing tool. In process step 352, a regularized layout is generated (such as 200 shown in FIG. 2C). In process step 354, a mask data preparation process (MDP) is performed on the regularized layout. The mask data preparation process may include, but is not limited to, one or more of re-targeting, sub-resolution assist feature (SRAF) insertion, optical proximity correction (OPC), optical rule checks (ORCs), and mask fracturing. The regularized layout from process step 352 serves to provide improved optimization of optical process models which, in turn, results in an improved MDP process. The result is a corrected layout which is generated in process step 356.

Figure 4:
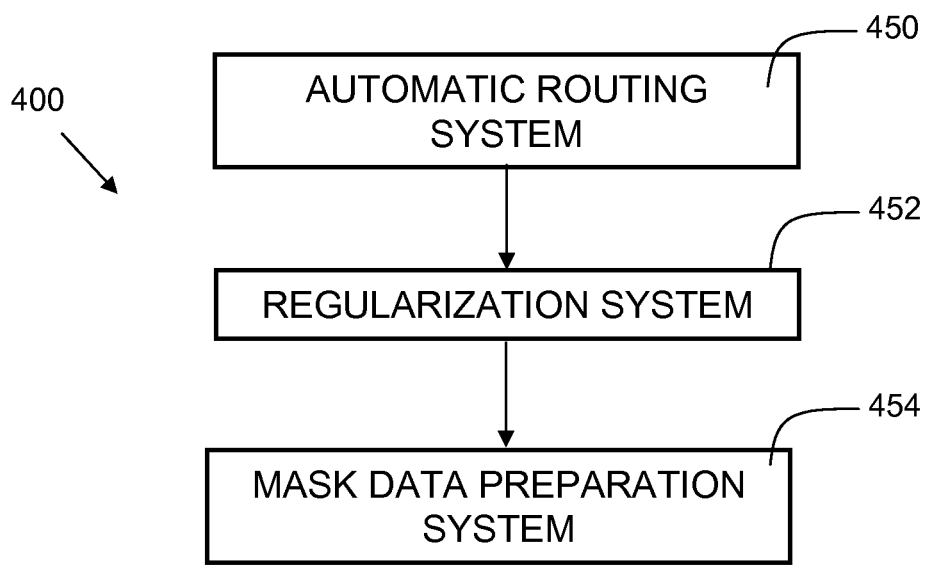
FIG. 4 shows a block diagram of a system in accordance with illustrative embodiments.

FIG. 4 shows a block diagram of a system 400 in accordance with illustrative embodiments. An automatic routing system 450 inputs data into regularization system 452 which generates a regularized layout. The regularized layout is input to mask data preparation system 454. Mask data preparation (MDO) system 454 may include, but is not limited to, functions such as optical proximity correction (OPC), Source-Mask Optimization (SMO), re-targeting, sub-resolution assist feature (SRAF) insertion, optical rule checks (ORCs), and mask fracturing. In some embodiments, the system for generating the regularized layout may be integrated into the automatic routing system. In other embodiments, the system for generating the regularized layout may be integrated into the mask data preparation system.

Figure 5:
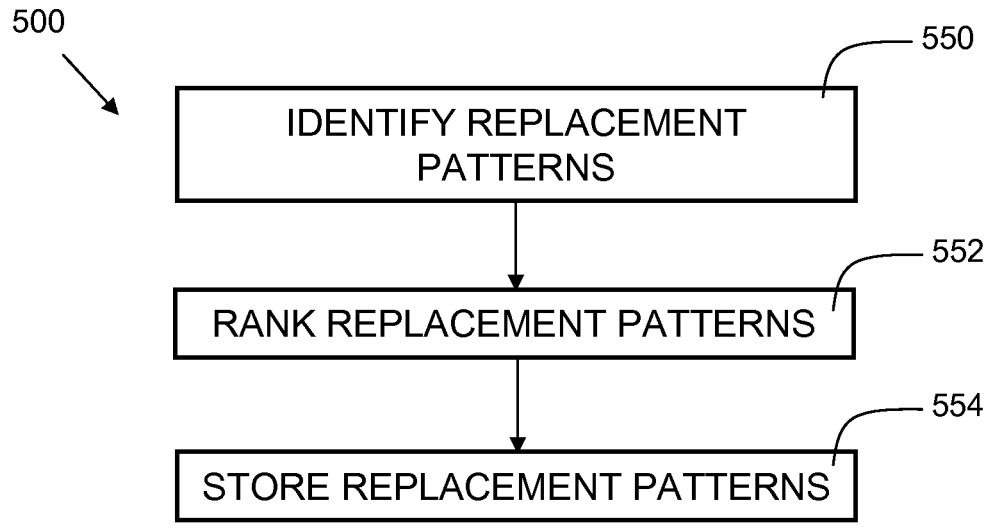
FIG. 5 is a flowchart indicating process steps for building a library of pattern functions in accordance with illustrative embodiments.

FIG. 5 is a flowchart 500 indicating process steps for building a library of replacement patterns in accordance with illustrative embodiments. In process step 550, replacement patterns are identified. These replacement patterns may come from a layout that has been previously fabricated, in which case, data such as yield and printability may be available for deriving a replacement pattern score. In other embodiments, the replacement patterns may be designs that are not yet implemented in any fabricated integrated circuits.

In process step 552, multiple replacement patterns that share a similar pattern function (e.g. connectivity) are ranked, such as by using the formula:

$$S=K_1*A+K_2*B+K_3*C+K_4*D+K_5*E$$

as previously described.

In process step 554, the best replacement patterns are stored in a computer-readable non-transitory medium. The best replacement patterns may be the replacement patterns with the maximum scores for a given pattern function. In some embodiments, the replacement patterns are stored in a database. In some embodiments, additional metadata pertaining to each replacement pattern may also be stored. This metadata may include, but is not limited to, boundary data (how close lines run along the edge of the pattern), application data (e.g. type of circuit the pattern is well-suited for, such as SRAM), or the like. The metadata may be used to further qualify a replacement pattern to be used.

Figure 6:
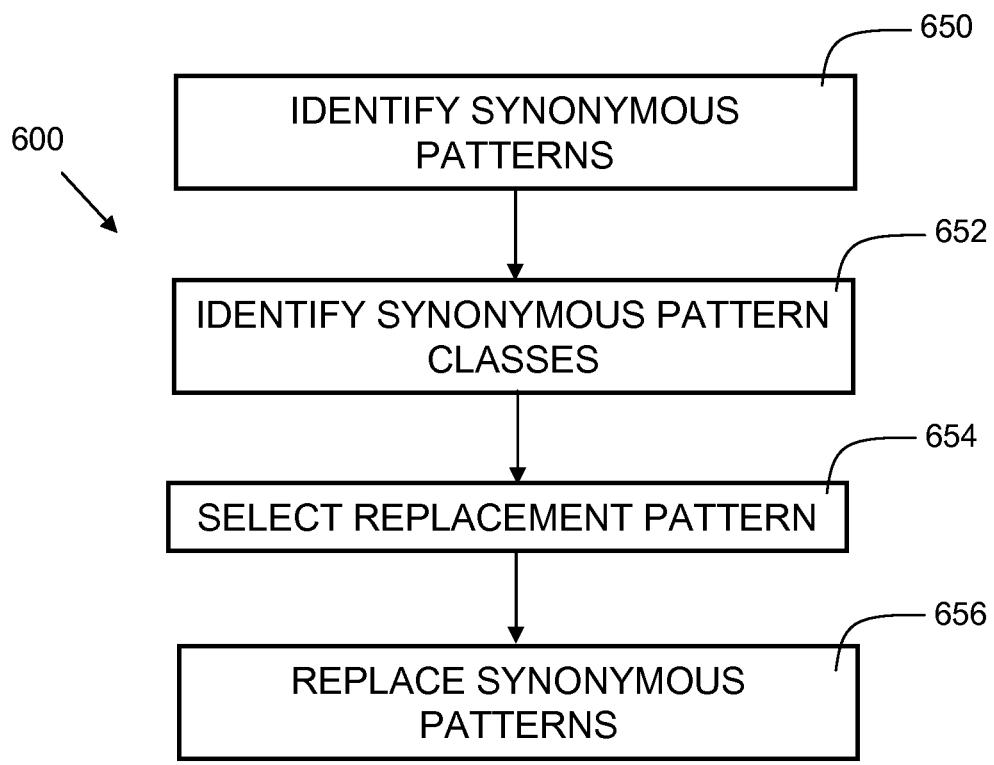
FIG. 6 is a flowchart indicating process steps for pattern replacement in accordance with illustrative embodiments.

FIG. 6 is a flowchart 600 indicating process steps for pattern replacement in accordance with illustrative embodiments. In process step 650, synonymous patterns are identified in a layout. In process step 652, synonymous pattern classes are identified. Each group of synonymous patterns that can be replaced by a single replacement pattern makes up a synonymous pattern class. The synonymous patterns are classified as belonging to a particular synonymous pattern class. A layout may have multiple synonymous pattern classes. The synonymous pattern classes may be described as:

$$C(X,Y)$$

where for class C, X is the number of synonymous patterns in the class C, and Y is the total number of patterns from class C in the layout to be regularized.

The synonymous pattern classes may be ranked and sorted in order to establish criteria for when to attempt replacement of patterns in a synonymous pattern class. The ranking may comprise computing the product of X and Y for each synonymous pattern class. For example, a layout may comprise three pattern classes, C1, C2, and C3, where:

$$C1=C(5,20000)=100,000;$$

$$C2=C(18,5000)=90,000; \text{ and}$$

$$C3=C(2,6)=12.$$

In this example, synonymous pattern class C1 has 5 synonymous patterns, and there are 20,000 occurrences of a pattern from the set of 5 patterns in a layout, resulting in a synonymous pattern class score of 100,000. Therefore, C1 may receive a high ranking, since it involves a large number of occurrences in the layout. Synonymous pattern class C2 has a large number of synonymous patterns (18), but is less prevalent within the layout (only 5000 occurrences), resulting in a synonymous pattern class score of 90,000. Synonymous pattern class C3 may be ranked low, since there are only two patterns and very few occurrences within the layout, resulting in a synonymous pattern class score of 12.

In some embodiments, all synonymous pattern classes may be replaced with a replacement pattern, regardless of the score (rank) of the synonymous pattern class. In other cases, only synonymous pattern classes above a certain score are subjected to replacement with a replacement pattern.

In process step 654, a replacement pattern is selected. This selection may be based on scoring or ranking multiple replacement patterns and then selecting the replacement pattern with the best score or rank.

In process step 656, the synonymous patterns are replaced with the replacement pattern. Each synonymous pattern in every synonymous pattern class is replaced with a corresponding replacement pattern. The corresponding replacement pattern may be the best in-class pattern determined during the compilation of layout regularization data, as determined by having a maximum replacement pattern score. Process steps 650-656 may be performed multiple times in an iterative manner to achieve the desired level of regularization.

Figure 7:
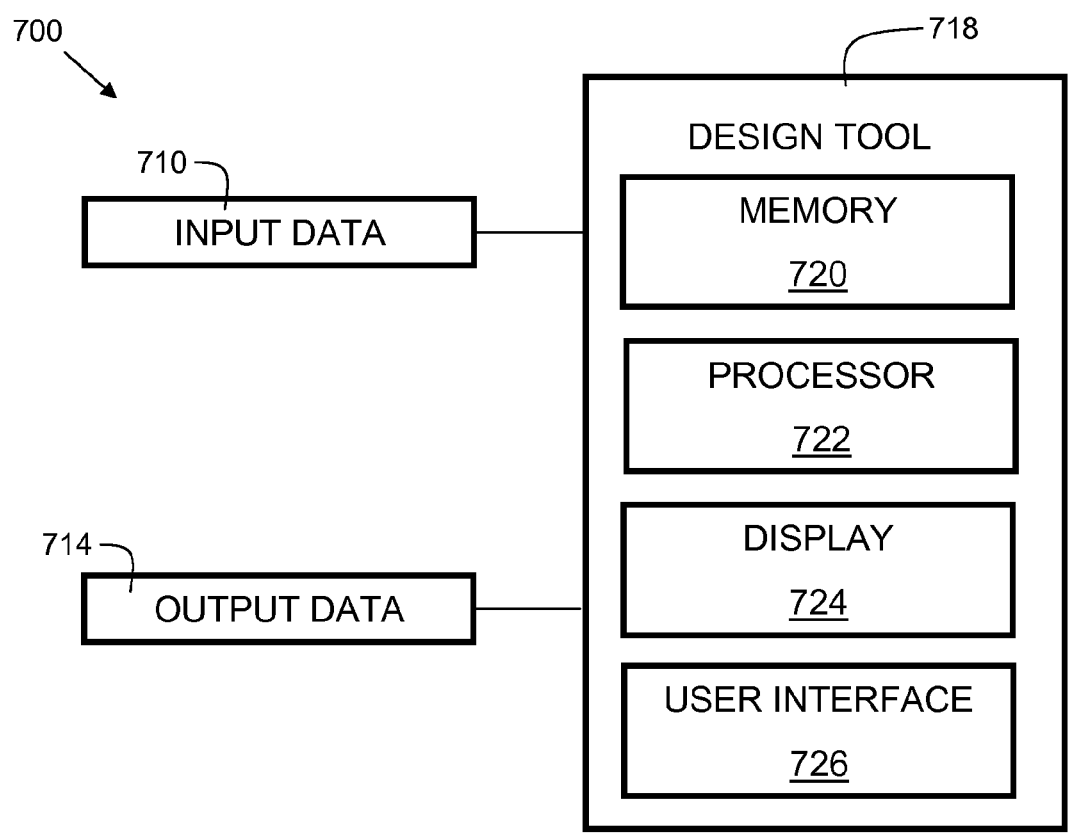
FIG. 7 is a block diagram of a system for generating layout data in accordance with illustrative embodiments.

FIG. 7 is a design system 700 in accordance with an embodiment of the present invention. System 700 includes a design tool 718. Design tool 718 may be a computer comprising memory 720, and a processor 722 which is configured to read and write memory 720. The memory 720 may be a non-transitory computer-readable medium, such as flash, ROM, non-volatile static ram, or the like. The memory 720 contains instructions that, when executed by processor 722, control the various subsystems to operate system 700. Design tool 718 may also include a display 724 and a user interface 726 for interacting with the system 700. The user interface 726 may include a keyboard, touch screen, mouse, or the like.

The design tool 718 may receive input data 710. Input data 710 may include a design structure, such as a wiring layout generated by an automatic routing system. The design structure may be a logical simulation design structure generated and processed by a design process to produce a logically equivalent functional representation of a hardware device. The design structure may also, or alternatively, include data and/or program instructions that when processed by design tool 718, generate a functional representation of the physical structure of a hardware device. The input data 710 may include hardware-description language (HDL) design entities or other data structures conforming to and/or compatible with lower-level HDL design languages such as Verilog and VHDL, and/or higher level design languages such as C or C++.

The design tool 718 may generate output data 714. The output data may reside in a storage medium in a data format used for the exchange of layout data of integrated circuits (e.g. information stored in a GDSII (GDS2), GL1, OASIS, or any other suitable format for storing such design structures). Output data 714 may comprise regularized layout data, and may further include information such as, for example, test data files, design content files, manufacturing data, layout parameters, wires, levels of metal, vias, shapes, data for routing through the manufacturing line, and any other data required by a semiconductor manufacturer to produce embodiments of the present invention.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While embodiments of the invention have been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of embodiments of the invention.

What is claimed is:

1. A method of compiling layout regularization data, comprising:

identifying a plurality of replacement patterns for use in an integrated circuit layout;

determining, by at least one computing device, a replacement pattern score for each replacement pattern that shares a similar pattern function; and storing the replacement pattern with a maximum replacement pattern score in a computer-readable medium;

wherein the determining the replacement pattern score comprises determining a minimum number of wire turns;

wherein the determining the replacement pattern score further comprises determining a minimum wire length, wherein an increase in minimum wire length decreases the replacement pattern score; and wherein determining the replacement pattern score further comprises determining a product of a total number of different patterns to be replaced by the replacement pattern, and a total number of occurrences of the replacement pattern.

2. The method of claim 1, wherein determining a replacement pattern score comprises determining a printability factor.

3. The method of claim 1, wherein determining a replacement pattern score comprises determining a yield factor.

4. The method of claim 1, wherein determining a replacement pattern score comprises determining a double-patterning compatibility factor.

5. A method of designing an integrated circuit, comprising:
   identifying, by at least one computing device, a plurality of synonymous patterns in an integrated circuit layout;
   classifying, using the at least one computing device, a plurality of synonymous patterns into one or more synonymous pattern classes;
   determining a replacement score by determining a product of a total number of different patterns to be replaced by the replacement pattern, and a total number of occurrences of the replacement pattern; and
   replacing, by the at least one computing device, each synonymous pattern in every synonymous pattern class with a corresponding replacement pattern to generate a regularized layout;
   wherein identifying a plurality of synonymous patterns comprises identifying a plurality of patterns within the integrated circuit layout, wherein each synonymous pattern comprises different paths with identical termination points;
   wherein the identifying the plurality of synonymous patterns comprises identifying identical termination points comprising vias and wire connections;
   wherein the replacing each synonymous pattern in every synonymous pattern class with a corresponding replacement pattern further comprises selecting a replacement pattern with a replacement score that is a maximum replacement pattern score, wherein the replacement score is a function of wire length, and wherein an increase in wire length decreases the replacement pattern score.

6. The method of claim 5, further comprising applying a mask data preparation process to the regularized layout to generate a corrected layout.

7. A computer-readable storage device comprising instructions, said instructions, when executed by a processor, performing the steps of:
   identifying a plurality of synonymous patterns in an integrated circuit layout;
   classifying a plurality of synonymous patterns into one or more synonymous pattern classes;
   determining a replacement score by determining a product of a total number of different patterns to be replaced by the replacement pattern, and a total number of occurrences of the replacement pattern; and
   selecting a corresponding replacement pattern having a replacement score that is a maximum replacement pattern score, wherein the replacement score is a function of wire length, and wherein an increase in wire length decreases the replacement pattern score; and
   replacing each synonymous pattern in every synonymous pattern class with the corresponding replacement pattern to generate a regularized layout;
   wherein identifying a plurality of synonymous patterns comprises identifying a plurality of patterns within the integrated circuit layout, wherein each synonymous pattern comprises different paths with identical termination points.

8. The computer-readable storage device of claim 7, further comprising instructions that, when executed by a processor, perform the step of applying a mask data preparation process to the regularized layout to generate a corrected layout.

9. The computer-readable storage device of claim 8, further comprising instructions that, when executed by a processor, perform the step of determining a printability factor of a replacement pattern.

10. The computer-readable storage device of claim 8, further comprising instructions that, when executed by a processor, perform the step of determining a yield factor of a replacement pattern.

* * * * *